United States Patent
Wilkie

(10) Patent No.: US 7,559,007 B1
(45) Date of Patent: Jul. 7, 2009

(54) ENCODING AND DECODING WITH PUNCTURING

(75) Inventor: William A. Wilkie, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 638 days.

(21) Appl. No.: 11/373,705

(22) Filed: Mar. 10, 2006

(51) Int. Cl.
 *H03M 13/03* (2006.01)
(52) U.S. Cl. .................................... 714/790
(58) Field of Classification Search ................. 714/746, 714/786, 790, 781
 See application file for complete search history.

(56) References Cited

U.S. PATENT DOCUMENTS

| | | | |
|---|---|---|---|
| 6,016,568 A * | 1/2000 | Wolf et al. | 714/792 |
| 7,131,049 B2 * | 10/2006 | Kim et al. | 714/751 |
| 2004/0039985 A1 * | 2/2004 | Mikkola et al. | 714/776 |

OTHER PUBLICATIONS

Nikfal et al., FPGA implementation of a wireless modem suitable for digital satellite news gathering, 2006, IEEE, p. 1-5.*
Xilinx, Inc., "Reed-Solomon Decoder", DS252, Nov. 11, 2004, pp. 1-17, v5.1, available from Xilinx, Inc., 2100 Logic Drive, San Jose, CA 95124.

* cited by examiner

*Primary Examiner*—Shelly A Chase
(74) *Attorney, Agent, or Firm*—W. Eric Webostad; Thomas George

(57) ABSTRACT

Method and apparatus for coding and, more particularly, for Reed-Solomon encoding and decoding with puncturing are described. At least one core is generated responsive to a puncture pattern input provided to a core generator. The core may be an encoder core or a decoder core, or a combination thereof such as a CODEC. For this generation, the puncture pattern input, including puncture patterns, are for a polynomial generator. The at least one core is configured to provide encoding or decoding, as applicable, responsive to the puncture patterns for which it was configured as generated with the core generator.

20 Claims, 8 Drawing Sheets

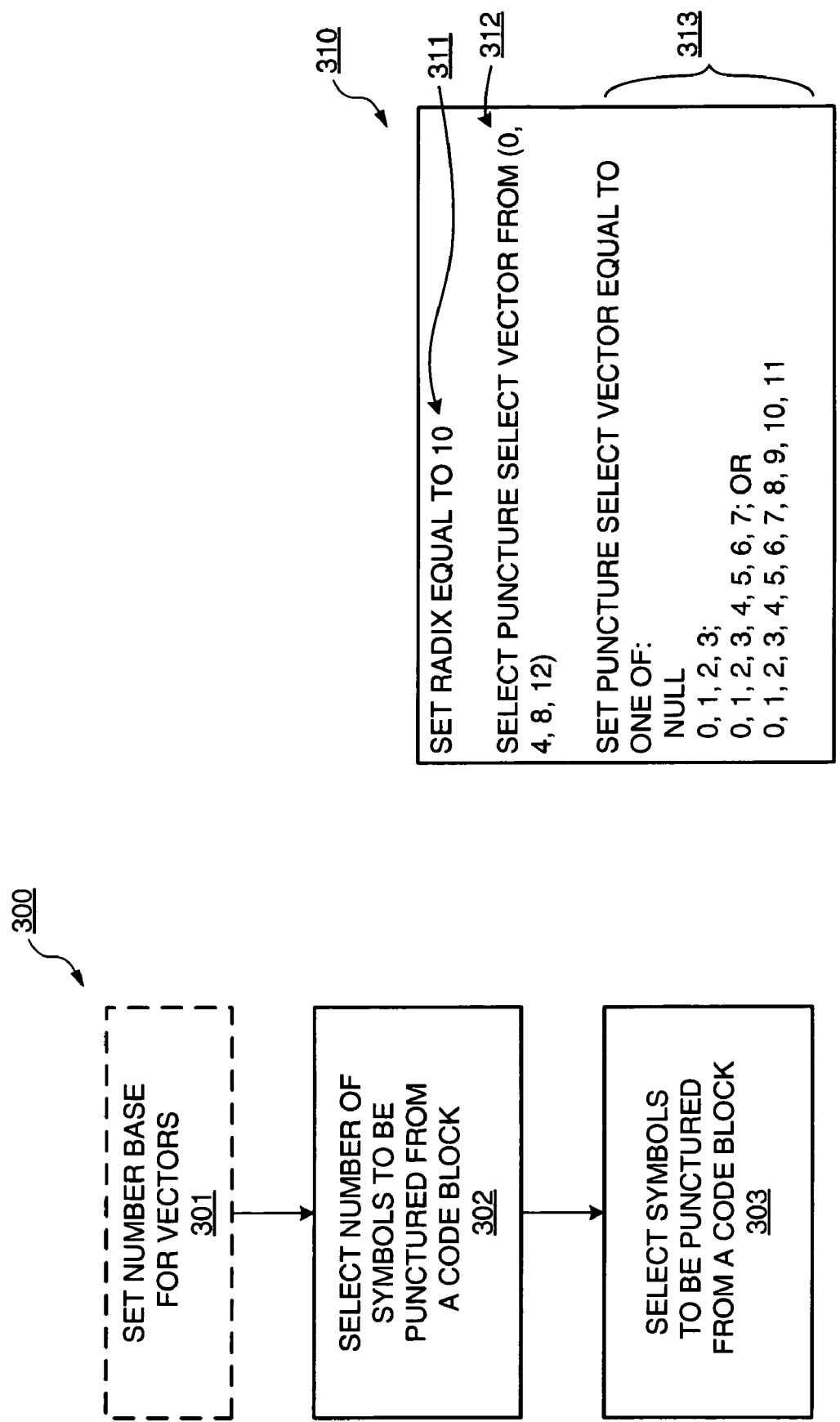

ENCODING AND DECODING WITH PUNCTURING

FIELD OF THE INVENTION

One or more aspects of the invention relate generally to coding and, more particularly, to Reed-Solomon ("RS") encoding and decoding with puncturing.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

A design for instantiation in programmable logic or in hardwired logic may be provided as a "netlist." With respect to programmable logic, conventionally what is known as a "core" is provided as a code listing from which a "netlist" may be generated for providing a configuration bitstream for configuring such programmable logic, such as programmable logic of an FPGA for example. Because cores are often instantiated in multiple applications by different users, cores tend to be associated with circuits that are commonly used. Examples of core circuits are a Reed-Solomon ("RS") encoder core and an RS decoder core. Notably, encoding and decoding cores may be combined to provide what is known as a "CODEC"; however, encoding and decoding cores may be provided as separate circuit blocks. Even though an example of a core is used herein, it should be understood use of the term "core" is meant to include a design for instantiation in either programmable logic or non-programmable logic, or a combination thereof.

RS codes are used to encode and decode data in many known digital applications, including forward error correction ("FEC") in communications systems. Generally, R check symbols are appended to K data symbols by an RS encoder prior to data transmission. This allows an RS decoder on a receiving end of the data transmission to correct up to R/2 symbol errors within a symbol code block of N symbols, namely where N equals K plus R. Hence, an RS code is a type of a code known generally as a block code.

An erasure, e, is a symbol in encoded data that a decoder determines has a reasonably high likelihood of containing one or more errors. For an RS decoder configured to handle erasures, the number of errors that may be corrected, E, is determined from Equation 1 below, where e is the number of erasures flagged or otherwise identified:

$$2E + e \leq R. \qquad (1)$$

Some RS decoders have an erasure input port to receive an asserted erasure signal responsive to an erased symbol being sampled from data input.

Known communication standards use variable length block codes, namely codes with variable block lengths. These variable length block codes may further have a variable number of check symbols, while using the same generator polynomial, g(x), as generally indicated below in Equation 2:

$$g(x) = \prod_{i=0}^{R-1} (x - \alpha^{Jx(Generator\_Start + i)}). \qquad (2)$$

Notably, the type of variable length block codes for these purposes is where the number of check symbols is varied by not transmitting some of them. For purposes of clarity by way of example and not limitation, an IEEE 802.16d communications standard allows blocks of length 124, 120, 116, or 112 with 16, 12, 8, or 4 check symbols respectively. An RS decoder configured to handle such a variable number of check symbols heretofore has generally led to significantly more circuitry than an RS decoder that is configured to handle a single fixed number of check symbols.

Accordingly, it would be desirable and useful to provide means to handle a variable number of check symbols, such as for RS decoding, with less circuitry than was previously used.

SUMMARY OF THE INVENTION

One or more aspects of the invention generally relate to coding and, more particularly, to Reed-Solomon ("RS") encoding and decoding with puncturing.

An aspect of the invention is a computer-implemented method for generating a core, wherein at least one step of the method is performed by a computer. A puncture pattern input is provided to a core generator, the puncture pattern input including puncture patterns for a generator polynomial. The core generated with the core generator is configured to provide coding responsive to the puncture patterns.

Another aspect of the invention is a decoder for a block code, comprising a memory and decoder circuitry having access to the memory. The memory stores sets of pre-computed initial error coefficient values for access by the decoder. The sets of pre-computed initial error coefficient values are for an error locator polynomial of a block code. The decoder circuitry is designed to receive a puncture select input and configured to select responsive to the puncture select input a set of pre-computed initial error coefficient values from the sets of pre-computed initial error coefficient values. The decoder circuitry is configured to decode with puncturing responsive to the block code and to a puncture pattern associated with the puncture select input.

Yet another aspect of the invention is an encoder for a block code. An encoding core is configured to receive input data and to provide output data encoded with the block code and with puncturing. The encoding core is configured to receive a puncture pattern select input and to provide ready for data signaling responsive to a puncture pattern selected responsive to the puncture pattern select input.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 3A is a flow diagram depicting an exemplary embodiment of a puncture pattern specification flow.

FIG. 3B is a pseudo-code listing depicting an exemplary embodiment of a puncture pattern file.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
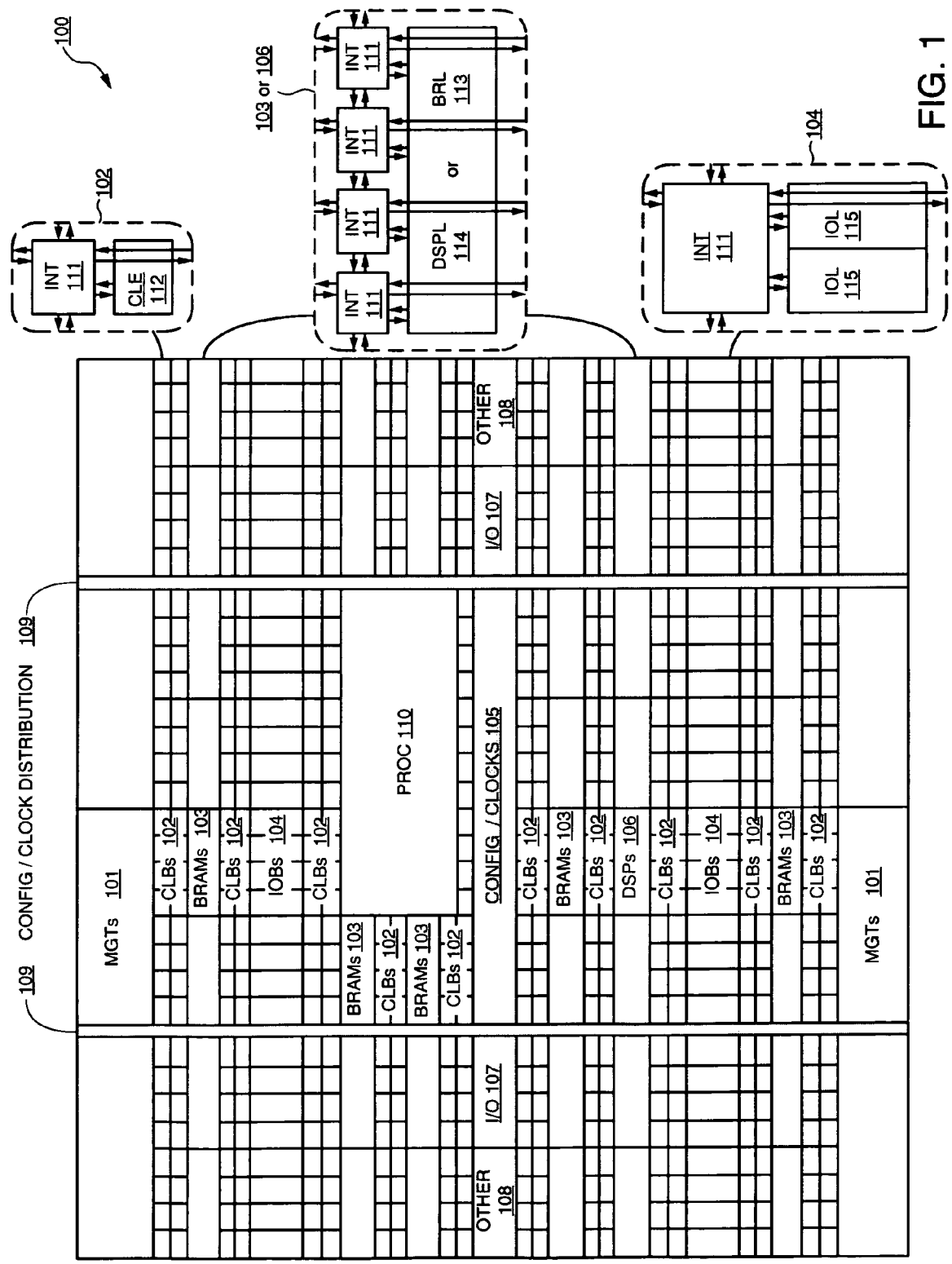
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include one or more dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

The following description is provided in terms of a core that may be instantiated in FPGA fabric or other programmable logic. However, it shall be appreciated from the description that follows that the core may be implemented in hardwired or static, in contrast to programmable, logic, and thus may be implemented in any of a variety of known integrated circuits that use Reed-Solomon ("RS") coding, where "coding" is meant to include either or both encoding and decoding.

What follows includes a description of an RS coding core, which may be an RS coder/decoder ("CODEC"), decoder, or encoder core that provides, for example, a means generally along the lines of specifying which symbols will be deleted or "punctured" from an RS code block. Thus, a relatively arbitrary number of symbols may be punctured from associated relatively arbitrary locations in an RS code block. A puncture pattern or patterns may be specified, such as by a user, by specifying parameters of an RS coding core and implementation of an associated RS encoder core and RS decoder core generated responsive to the specified puncture pattern or patterns. Although a user may customize one or more puncture patterns, real-time switching on a code block-by-block basis is facilitated by pre-defining a number of different puncture patterns from which a user may select.

Puncturing as described herein may be used to decode variable length RS codes having a fixed or variable number of check symbols, where such RS codes are all based on the same generator polynomial. Generally, an RS decoder core may be configured to handle a maximum length of an RS code length to be supported. This decoder may be configured to handle a single fixed number of check symbols, which may generally be set to the maximum number of check symbols to be supported. Any reduction in block length of a code block received by such an RS decoder core may thus be treated as having "missing" symbols. Notably, these symbols may not actually be "missing" but may be erasures replaced with dummy values to use a variable code length that is less than the maximum length supported by an implementation. By having an RS encoder core implementation in association with the RS decoder core, such missing symbols in code blocks may be treated as erasures with positions determined prior to transmission. In other words, if a single generator polynomial is used in an implementation to encode data, then variable length blocks may be treated as fixed length blocks with a variable number of symbols deleted in predetermined positions.

This deletion of a variable number of symbols, which variable number may include zero, namely deletion of no symbols, is referred to herein as "puncturing." Thus, code blocks with a variable number of check symbols may be decoded with circuitry overhead closer to that of a fixed length block implementation than a variable length block implementation. Although the description is in general terms of variability of check symbols, it should be appreciated that variable length in block symbols or check symbols or both may be implemented in accordance with this disclosure.

Figure 2A:
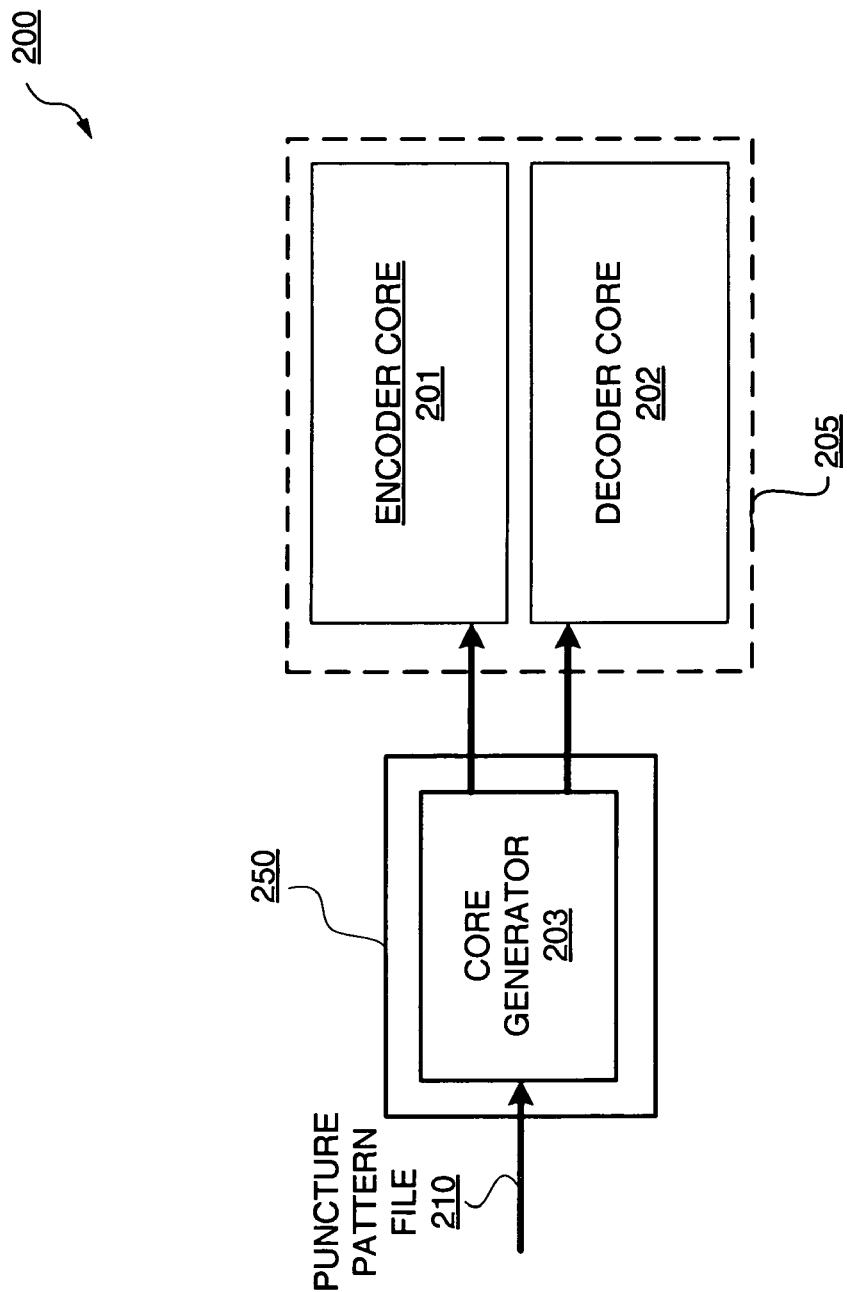
FIG. 2A is a block diagram depicting an exemplary embodiment of a core generator system flow.

FIG. 2A is a block diagram depicting an exemplary embodiment of a core generator system flow 200. As is known, a computer 250 may be configured with a core generator application 203. For example, CORE Generator System available from Xilinx of San Jose, Calif. is a design tool that delivers parameterized cores for Xilinx FPGAs. This software tool in particular may be implemented in either a Windows or UNIX environment. However, other known types of Electronic Design Automation ("EDA") software tools, along with other operating environments, may be used.

Puncture patterns file 210, such as may be defined by a user or may be generated by other means, may be input to computer 250 for use by core generator 203. In response to puncture pattern file 210, core generator 203 may generate either or both of an encoder core 201 or a decoder core 202. Optionally, these cores 201 and 202 may be generated in combination to provide a CODEC 205. However, for purposes of clarity and not limitation, it shall be assumed that separate encoder and decoder cores are generated.

Notably, cores 201 and 202 may be for implementation in programmable logic, such as of FPGA 100 of FIG. 1, or for hard-wired logic of an integrated circuit. Each of cores 201 and 202 may be configured for puncturing as described herein. Continuing the example of an RS decoder, although other types of block decoders may be implemented, decoder core 202 may be configured to delete specified symbols, namely puncturing those symbols, from an RS code block prior to decoding. A user may specify which symbols are to be punctured in puncture pattern file 210, namely parameters provided to core generator 203 for generating cores 201 and 202. The user may select a generally arbitrary number of symbols to be punctured from associated arbitrary locations in a code block as specified through core parameters input via puncture pattern file 210. RS encoder core 201 and RS decoder core 202, which are generated based on user-supplied puncture patterns, may have enhanced performance owing to predetermination of what symbols are to be deleted. Thus, switching between a number of different predefined puncture patterns in real time on a code block-by-code block basis is facilitated.

Assuming for purposes of clarity by way of example that the same generator polynomial is always used to encode data, in such instance, the variable length blocks may be considered as fixed length blocks with a variable number of symbols deleted. For the example of the IEEE 802.16d standard, a block length of 120 with 12 check symbols may be considered as an RS code block of block length 124 with 16 check symbols, where the last 4 symbols of the code block have been punctured. In this example, N is equal to 124, K is equal to 108, and R is equal to 16. From Equation (1), it may be understood that by treating the four punctured symbols as erasures, namely e equal to 4, Equation (1) becomes $2E+4 \leq 16$. Accordingly, the number of correctable errors for this example is 6, or E equal to that value to satisfy that equation. Notably, the number of corrected errors may be at most 6, but may be less than 6 depending on the number of errors occurring in a transmitted, encoded block. It should be appreciated from this example that the code block of block length 124 with 16 check symbols having the last 4 symbols of the code block punctured is equivalent to a code block of block length 120 with 12 check symbols. This assumes that the code block of block length 120 was generated with a generator polynomial of the form of Equation (2) with R set equal to 16.

Figure 2C:
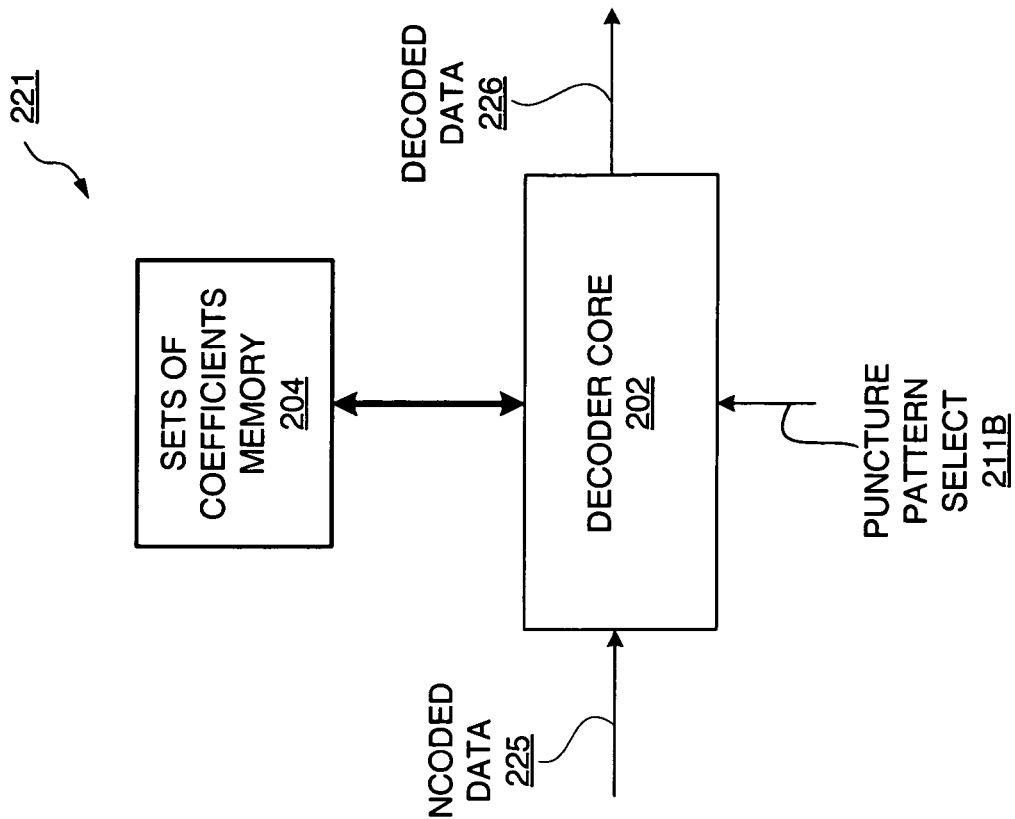
FIG. 2C is block diagram depicting an exemplary embodiment of a decoding system including a decoder core as may be implemented in one or more integrated circuits.
Figure 2B:
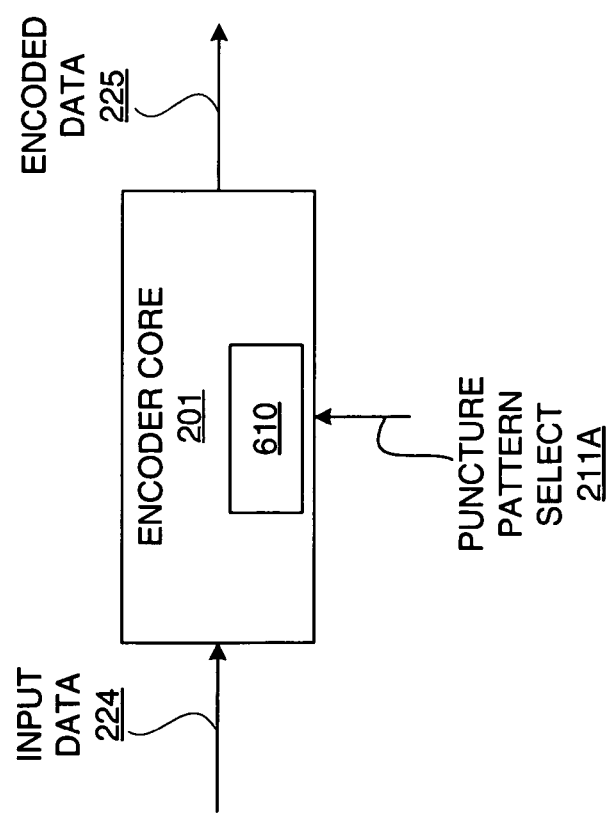
FIG. 2B is a block diagram depicting an exemplary embodiment of an encoder core as may be implemented in an integrated circuit.

FIG. 2B is a block diagram depicting an exemplary embodiment of an encoder core 201 of FIG. 2A, as may be implemented in an integrated circuit. FIG. 2C is block diagram depicting an exemplary embodiment of a decoding system 221 including a decoder core 202 of FIG. 2A coupled to memory 204, which may be implemented in one or more integrated circuits. For purposes of clarity by way of example and not limitation, it shall be assumed that decoder system 221 is implemented in one integrated circuit. Moreover, it should be appreciated that memory 204 may be part of a decoder core, such as decoder core 202, generated by core generator 203 of FIG. 2A.

With simultaneous reference to FIGS. 2B and 2C, it should be appreciated that cores 201 and 202 may be RS cores configured to accept generally arbitrary puncture patterns as defined by users to produce or decode encoded data 225, respectively. Because puncture patterns may be defined in advance for use by an encoder core 201 or a decoder core 202, one or more predefined puncture patterns may be stored, where a target puncture pattern for a next code block to be encoded or decoded may be selected by driving an input port, namely puncture pattern select signal 211A or 211B, with a pattern number associated with the target puncture pattern. The target pattern number may be provided to encoder core 201 or decoder core 202 via puncture pattern select signals 211A or 211B, respectively, at or proximal to the start of encoding or decoding of a code block. Encoder core 201 receives input data 224 and provides encoded output data 225. Thus, for example, output data 225 from encoder core 201 may for each code block have same or different puncture patterns as flagged by puncture pattern select signal 211A. Encoder core 201 thus uses patterns flagged by puncture pattern select signal 211A to provide punctured output data, which puncturing may be done for each code block output by encoder 201. Notably, rather than puncture pattern select signal 211A, flags may be part of an input data stream 224 to identify the puncture pattern for each block; however, for purposes of clarity by way of example and not limitation, it shall be assumed that a puncture pattern select signal is used to identify the puncture pattern for each block. Notably, pattern select circuitry 610 may be included as part of encoder core 201 for receiving puncture pattern select signal 211A, as described below in additional detail with reference to FIG. 6.

Thus, encoder core 201 may provide encoded data 225 having different or same puncture patterns for each code block. Such encoded data 225 may be transmitted via a communication channel (not shown) to decoder core 202. Puncture pattern select signal 211B may be synchronized with puncture pattern select signal 211A such that encoded data 225 may be decoded for same or different puncture patterns of the various code blocks thereof to provide decoded data 226. Decoder core 202 may be configured to access a set of coefficients from sets of coefficients stored in one or more memories 204. Because the locator polynomial coefficient values are pre-computed and stored owing to predetermination of the puncture patterns to be implemented, real-time decoding on a code block-by-code block basis is facilitated. Moreover, this real-time decoding on a code block-by-code block basis is facilitated for multiple puncture patterns.

FIG. 3A is a flow diagram depicting an exemplary embodiment of a puncture pattern specification flow 300. At 301, a number base for vectors to be used may optionally be set. Alternatively, a default base numbering system may be used. At 302, a number of symbols to be punctured from a code block are selected. Notably, the number of symbols to be punctured may be any integer value subject to the types of block codes being supported. Again, IEEE 802.16d gives some examples of types of block codes that may be used; however, this is merely an example as it should be understood that many other known block code configurations may be used.

At 303, the symbols to be punctured from a code block are selected. These selected symbols to be punctured are for each of the types of puncture patterns to be implemented. Such symbols may be at the beginning of a code block, at the end of a code block, or anywhere in between the beginning and end of a code block. Again, the location and the number of symbols are generally arbitrary, subject to the limitations of the block codes being supported.

FIG. 3B is a pseudo-code listing depicting an exemplary embodiment of a puncture pattern file 310. Puncture pattern file 310 is an example of a puncture pattern file, such as puncture pattern file 210 of FIG. 2A, that may be provided to a core generator, such as core generator 203 of FIG. 2A. Radix setting 311 specifies a base of numbers to be used for the vectors of puncture pattern file 310. Again, this setting may be optional depending on the type of implementation. The number of symbols to be punctured from a code block may be defined as puncture select vectors 312. In this particular example, there are four puncture select vectors 0, 4, 8, and 12 from which a selection may be made. These puncture select vectors indicate the number of symbols that may be punctured from a code block; however, it should be understood that these or other numerical examples may be implemented. Furthermore, it should be understood that multiple puncture patterns may be used with the same number of symbols being punctured. For example, a puncture select vector of (4, 4, 4, 4) may be used, where four symbols are punctured for each such vector but the sets of symbols punctured are different from one another, though they may have some overlap or union space. Moreover, it should be appreciated that puncture pattern select signals 211A and 211B of FIGS. 2B and 2C, respectively, may have values, such as 0 through 3, which correspond to puncture select vectors 0, 4, 8, and 12 respectively of vectors 312. Thus, for example, if puncture pattern select signal 211B were equal to 1, then the puncture pattern associated with deletion of 4 symbols, as indicated by vectors 312, would be selected.

For each of vectors 312, there may be a corresponding puncture pattern 313. The setting of puncture patterns 313 identifies which symbols are punctured for each of the puncture select vectors 312. Puncture pattern select vector 1 as associated with puncture select vectors 312 indicates that a pattern of deleting symbols 0 through 3 of patterns 313 is to be used. Continuing this example, puncture select vectors 2 and 3 of puncture select vectors 312 are associated with deletion of symbols 0 through 7 and 0 through 11, respectively, of a code block as indicated in patterns 313. However, puncture select vector 0 corresponds to none of puncture patterns 313, meaning that none of the symbols are to be deleted from a code block. Notably, the null set, namely deleting no symbols for puncturing, may be implicit and thus no value need be indicated as part of patterns 313 even though a "NULL" placeholder is indicated in the example for purposes of clarity.

In an implementation, code block entries may be counted backwards from the last symbol in a code block, with 0 being the last symbol. Thus, using the example of FIG. 3B, if puncture pattern select signal 211B of FIG. 2C was set equal to 1, symbols 0, 1, 2, and 3 may all be punctured as the last four symbols in the code block using that pattern. While the punctured symbols do not have to be at the end of the code block, it should be appreciated that by puncturing at the end of a code block, the puncturing scheme may be implemented for any code block length, including a variable block length. In contrast, if 0 were used for the first symbol in a code block, the hardware for decoding would be more complicated. Again, it should be appreciated that the above numerical examples are provided for purposes of clarity by way of example and not limitation. Thus, it should be appreciated that any puncture pattern for a parameterizable core may be implemented in accordance with the scope of this disclosure.

Figure 4B:
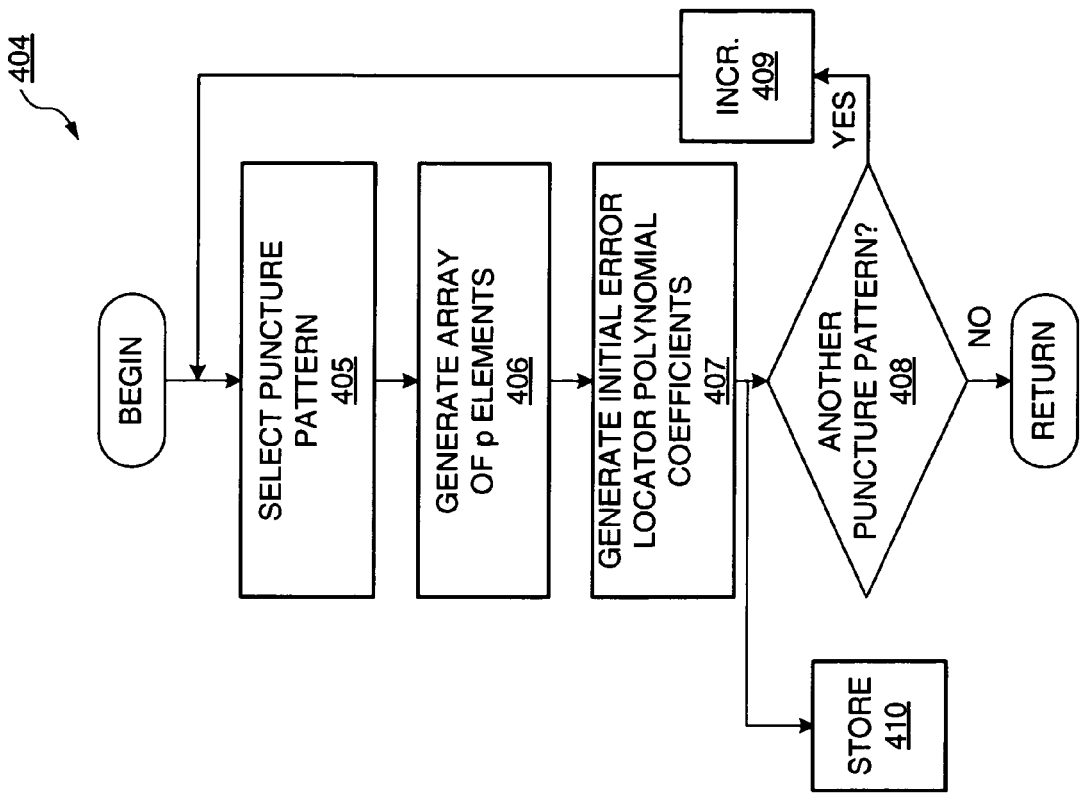
FIG. 4B is a flow diagram depicting an exemplary embodiment of an initial coefficient values generation flow for an Error Locator Polynomial.
Figure 4A:
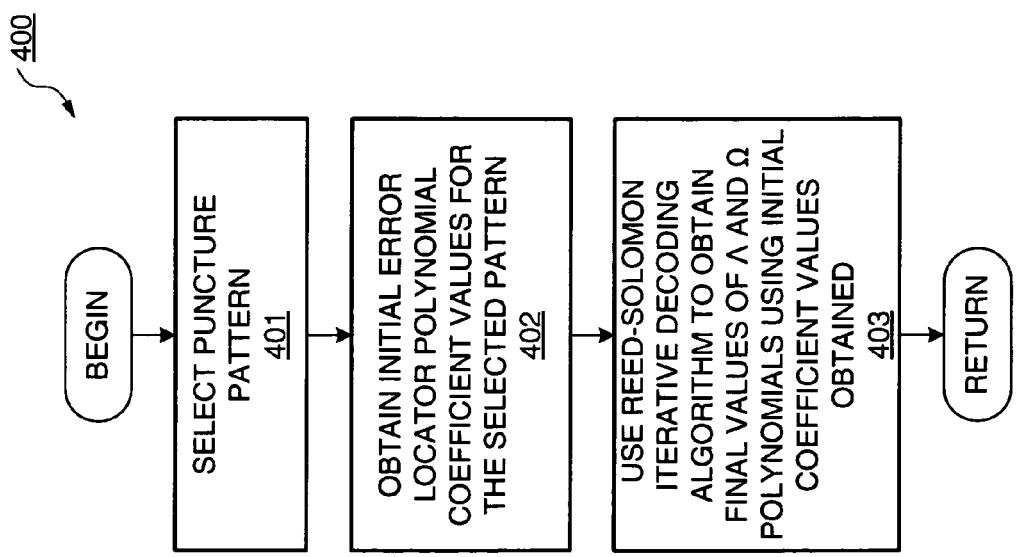
FIG. 4A is a flow diagram depicting an exemplary embodiment of a decoding flow with puncturing.

FIG. 4A is a flow diagram depicting an exemplary embodiment of a decoding flow 400 with puncturing. At 401, a puncture pattern is selected. At 402, initial Error Locator Polynomial coefficient values for the pattern selected at 401 are obtained. Notably, the number of coefficient values, if any, depends on the puncture pattern selected at 401. Thus, for example, if a puncture pattern having no symbols deleted or punctured is selected, then the initial Error Locator Polynomial coefficient values are all 0, except for the least significant value, which is always 1. However, if the puncture pattern selected at 401 deletes 4 symbols, then there will be 4 roots of the Error Locator Polynomial. In other words, the degree of the polynomial changes with the number of punctured symbols. Notably, generation of these initial coefficient values is described in additional detail with reference to FIG. 4B.

At 403, an iterative decoding algorithm for RS decoding may be used to obtain final values of an Error Locator Polynomial ("Λ") and an Error Evaluator Polynomial ("Ω"). After initial computation of both the Error Locator Polynomial and Error Evaluator Polynomial, the RS decoding algorithm uses iterations for decoding. Again, the roots of the Error Locator Polynomial may be used to determine the location of symbol erasures within a code block being decoded.

Owing to predetermination of a puncture pattern, the Error Locator Polynomial may be initialized to a value that contains roots corresponding to the location of any and all punctured symbols. In other words, the coefficient values obtained at 402 may be used to initialize the Error Locator Polynomial at 404. Again, this may be done as the location of such punctured symbols is predetermined. A decoder, such as decoder core 202 of FIG. 2C, may then reconstruct the punctured symbols. In other words, the punctured symbols are treated as symbols received with errors and then those errors are corrected. A dummy value is therefore sampled by the decoder, such as decoder core 202 of FIG. 2C, in place of each punctured symbol. Thus, the obtaining of the initial Error Locator Polynomial coefficient values at 402 as a lead-in to iterative decoding at 403 avoids having to assert an erase input to a decoder and "build up" initial values for the Error Locator Polynomial as the code block is received. Rather, with puncturing this overhead may be avoided, as the puncture positions are known in advance and thus initial Error Locator Polynomial coefficient values do not have to be "built up", namely iteratively computed, in real time, but may be pre-computed for access on demand. Accordingly, all initialization values for all specified puncture patterns may be pre-computed and stored in memory look-up tables.

FIG. 4B is a flow diagram depicting an exemplary embodiment of an initial coefficient values generation flow 404 for an Error Locator Polynomial. At 405, a puncture pattern is selected. At 406, an array of p elements is generated, where p is the number of punctured symbols for p an integer equal to or greater than 0, for the puncture pattern selected at 405. Each ith element is computed for this array as set forth below in Equation (3) as:

$$E(i) = \alpha^{hP(i)}. \quad (3)$$

In Equation (3), i ranges from 0 to (p−1). The position index P(i) is the position of the ith punctured symbol. In the example implementation, 0 is for the last symbol in a received code block, 1 is the second-to-last symbol in a received code block, and so on, for purposes of decoding. In Equation (3), h is the RS generator polynomial scaling value, as previously defined in Equation (2). Moreover, in Equation (3) α is the primitive root of the Galois field polynomial. An example of a value for the primitive root of the Galois field polynomial for an RS block code described herein is two.

At 407, initial Error Locator Polynomial coefficients are generated. Thus, an initial Error Locator Polynomial as a function of x as defined in Equation (4) may be constructed according to:

$$\Lambda(x) = \prod_{i=0}^{p-1} (E(i)x + 1). \quad (4)$$

Figure 4C:
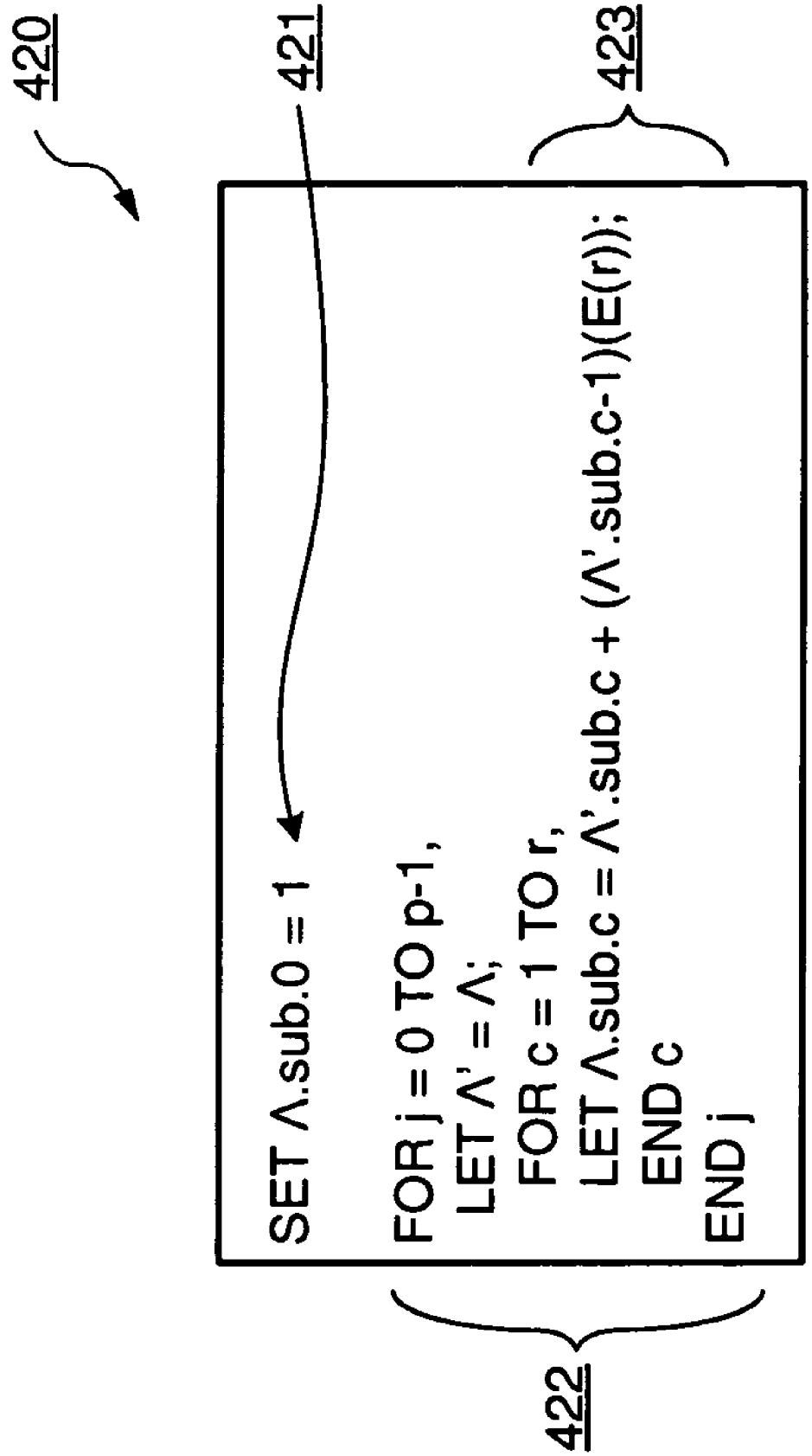
FIG. 4C is a listing diagram depicting an exemplary embodiment of a pseudo-code listing to compute initial Error Locator Polynomial coefficients.

The coefficients of this Error Locator Polynomial may be computed at 407 by iterating through the loop 422 in pseudo-code listing 420 of FIG. 4C, including the nested loop 423 thereof.

FIG. 4C is a listing diagram depicting an exemplary embodiment of a pseudo-code listing 420 to compute initial Error Locator Polynomial coefficients. With simultaneous reference to FIGS. 4B and 4C, generation of initial Error Locator Polynomial coefficients is further described.

At 421, the initial Error Locator Polynomial ("$\Lambda_0$") is set equal to 1. At loop 422, for j equal to 0 to (p−1), for p the size of the above-identified array of elements, namely the number of punctured symbols for a then-current selected puncture pattern, the loop 422 is iteratively run, and within loop 422 nested loop 423 is iteratively run. In each instance of j, the Error Locator Polynomial is iteratively composed. In this example, r is the maximum number of check symbols, and c is incremented from 1 to r. The Error Locator Polynomial at c ("$\Lambda_c$") is the cth coefficient of the Error Locator Polynomial as a function of x ("$\Lambda(x)$"), with $\Lambda_0$ being the lowest order coefficient as previously set equal to 1 and $\Lambda_r$ being the highest order coefficient. Thus, coefficients for each iteration of j may be iteratively computed to compose initial Error Locator Polynomial coefficients to represent an entire polynomial. Notably, the addition and multiplication operations shown in listing 420 may be performed using Galois field arithmetic.

Notably, after each set of initial Error Locator Polynomial coefficients is generated at 407, such initial Error Locator Polynomial coefficients generated may be stored at 410 for subsequent use. For example, such sets of coefficients may be stored in sets of coefficients memory 204 of FIG. 2C.

At 408, it is determined whether there is another puncture pattern for which initial Error Locator Polynomial coefficients are to be generated. This is because a set of initial Error Locator Polynomial coefficients is determined for each puncture select vector, including when such vector is equal to 0. If there is another puncture pattern to have initial Error Locator Polynomial coefficients generated for it, then the puncture pattern may be incremented at 409 for selecting a next puncture pattern at 405. Again, a puncture pattern select value, such as 0 through 3 in the above example, may be used to sequentially increment through each puncture pattern to be supported in an implementation.

Figure 5:
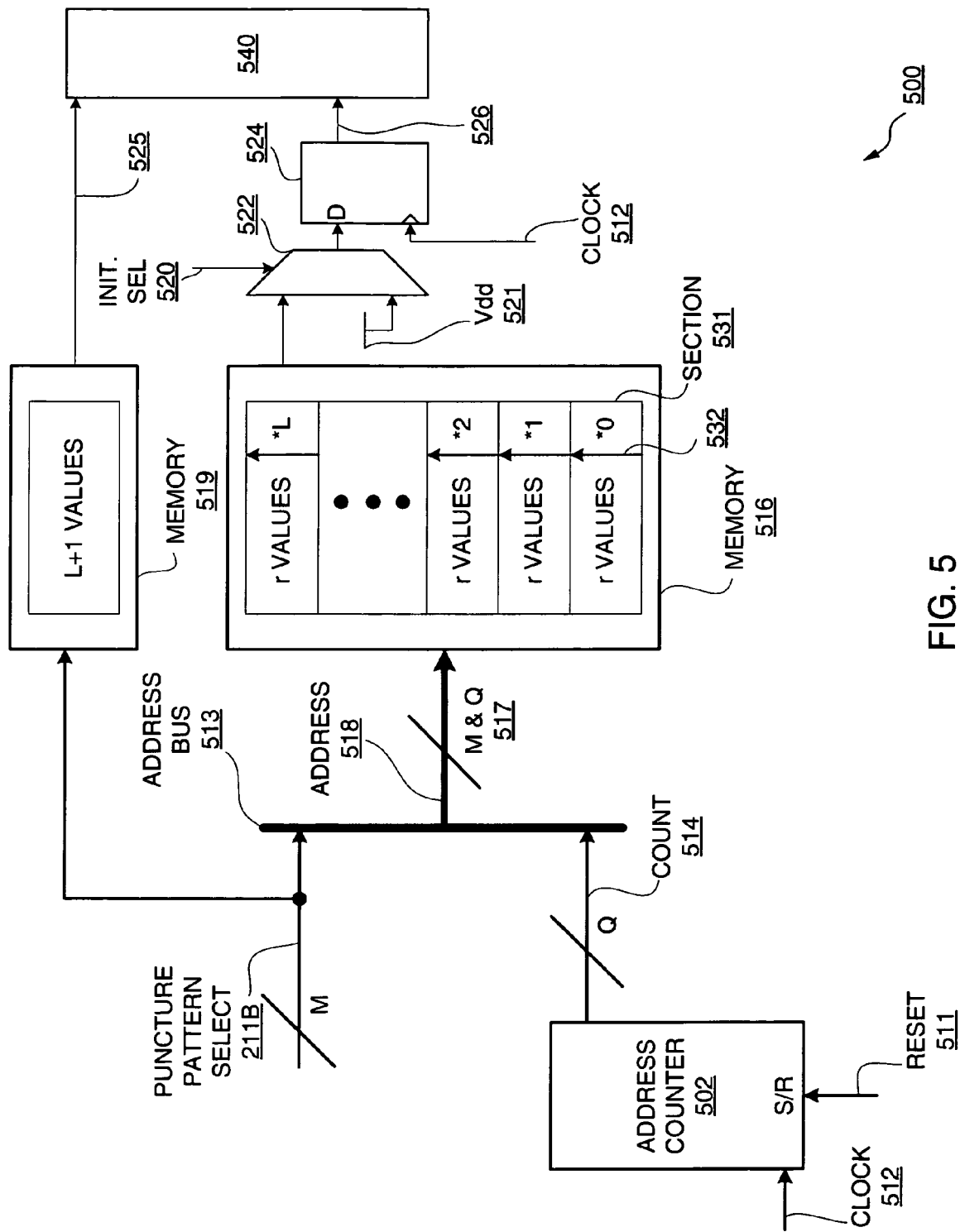
FIG. 5 is a block/schematic diagram depicting an exemplary embodiment of a decoder having two memories and an address counter.

FIG. 5 is a block/schematic diagram depicting an exemplary embodiment of a decoder 500 having memories 516 and 519 and address counter 502. Notably, decoder 500 may be an implementation of decoding system 221 of FIG. 2C. However, it should be appreciated that other implementations in accordance with the scope of this disclosure other than that shown for decoder 500 may be implemented as an RS decoder with puncturing capability.

In this example, there are (L+1) valid puncture patterns. Initial coefficients of the Error Locator Polynomial are shifted out sequentially from memory 516, which may be an implementation of sets of coefficients memory 204 of FIG. 2C. However, the lowest order coefficient value is always 1, so there is no need to store that coefficient in memory 516. Rather, a logic 1 voltage value, such as Vdd 521, may be tied to an input port of multiplexer 522. Another input port of multiplexer 522 may be coupled to output of memory 516. A control select signal, namely initial select signal 520, may be used to switch between the inputs to multiplexer 522 to provide an output to flip-flop 524. If initial select signal 520 is asserted to select Vdd 521 for output, it may be asserted for one initial clock cycle of clock signal 512 for the first coefficient of a polynomial to be output. Notably, the first value of an Error Locator Polynomial in this example is always a value of 1. Output of multiplexer 522 is provided as an input to flip-flop 524. At this same time, or substantially proximate to this same time, of selection of Vdd 521 for output from multiplexer 522, address counter 502 is initialized, such as by reset signal 511, to 0. Address counter 502 counts responsive to clock signal 512.

Address counter 502 outputs a count which is Q bits wide, namely count signal 514, to address bus 513. The bits of count signal 514 are provided by address bus 513 as the Least Significant Bits ("LSBs") of address signal 518. These LSBs are used by memory 516 to index a second value of the Error Locator Polynomial, namely the first value in the set, and progressively increment therefrom to obtain each coefficient value in the set responsive to clock signal 512. Accordingly, each Error Locator Polynomial coefficient in turn within an address range in memory 516 may be output from memory 516. Thus, for example, for a puncture pattern 0 as indicated for section 531, for a maximum of r coefficients, the LSBs as provided from count signal 514 are used to index and increment each of the r values within section 531 as indicated by arrow 532 starting at a lowest address range of section 531 and progressing to a highest address range of section 531. Thus, each coefficient within section 531 may be accessed and output from memory 516, in a sequential stream, to an input of multiplexer 522.

Selection of section 531 is determined by the Most Significant Bits ("MSBs") of address 518. Puncture pattern select signal 211B, which may be M bits wide, is provided to address bus 513 along with Q bits of count signal 514 to provide address signal 518 as M and Q bits 517. The M bits of puncture pattern select signal 211B are used as the MSBs for providing address signal 518, where address signal 518 is provided from address bus 513 to memory 516. Thus, the MSBs of address signal 518 may be used to select one of 0 to L blocks, such as for example section 531 within memory 516.

Notably, flip-flop 524 as well as address counter 502 are clocked responsive to clock signal 512. Output of flip-flop 524, namely initial Error Locator Polynomial coefficient values output signal 526, is provided to RS decode circuitry 540. In other words, the initial Error Locator Polynomial coefficients are passed on to circuitry to perform the iterative RS decoding algorithm to determine final values of the Error Locator Polynomial and the Error Evaluator Polynomial. Notably, RS decode circuitry 540 includes control/glue logic. As circuitry for such iterative decoding, apart from puncturing as already described, is well known, it is not described herein for purposes of clarity. However, it should be appreciated that because clock signal 512 is generally continuously run, control circuitry for obtaining initial Error Locator Polynomial coefficients may be slower than the frequency of clock signal 512 for outputting latched values of such coefficients for iterative decoding.

Additionally, for iterative decoding, the number of symbols punctured may be known by the decoder in advance of decoding. This information is provided by puncture pattern select signal 211B. As previously described, puncture pattern select signal 211B may be a numerical value which is an index to puncture select vectors. In the above example of FIG. 3B, the puncture select vectors were 0, 4, 8, and 12; however, again it should be emphasized that these or other values or a combination of any of these numbers thereof may be used. Thus, in addition to being provided to address bus 513, the M bits of puncture pattern select signal 211B are provided to memory 519 to access one of the (L+1) values, where again (L+1) indicates the number of valid puncture patterns. Output 525 of memory 519 is provided to RS decode circuitry 540. In the example of FIG. 3B, if puncture pattern select signal 211 were equal to 3, output 525, namely the number of punctured symbols output 525, would be 12. Notably, because the puncture patterns and initial coefficient values for the Error Locator Polynomial may be predetermined, memories 519 and 516 may be separate read-only memories; alternatively, a single memory with segmented address spaces may be used.

Notably, in the above example, it has been assumed that r is a power of two. It should be appreciated that if r is not a power of two, then memory address spaces in segmented memory 516 may be padded with 0s (or any other value) to make up for any differences in r not being a power of two. This 0-padding may be inserted at the upper end of the address space of each code block of memory 516, such as section 531.

Although a particular circuit implementation has been described with respect to FIG. 5, it should be appreciated that other circuit implementations may be used in accordance with this disclosure. For example, rather than having the least significant coefficient produced by tying an input of multiplexer 522 to a logic value which produces a value of 1, such least significant coefficient may be stored in memory 516. Moreover, rather than having memory included in decoder 500, such memory may be separate therefrom as illustratively shown in FIG. 2C where encoded data 225 is received by decoder core 202 which selects a set of coefficients from memory 204 for providing decoded data 226. Moreover, rather than using ROM, other types of non-volatile memory, including flash and fuse banks, may be used, among other types of known non-volatile memories. Furthermore, memory 204 of FIG. 2C may store sets of coefficients which are loaded into memory of decoder 202, where decoder 202 could be implemented similarly to decoder 500 of FIG. 5, having internal memories 516 and 519. Such internal memories, for example, may be a type of high-speed access memory, such as static random access memory ("SRAM") for purposes of increased performance. Furthermore, rather than having coefficients serially output from memory 516, memory 516 may be configured to provide output in parallel, in which embodiment a clock other than the same clock used for address counter 502 may be used to clock out registered memory at a slower frequency than the frequency of clock signal 512. These are but a few of the variations that may be implemented.

However, it should be appreciated that in each implementation, a circuit to build coefficient values may be avoided. Furthermore, circuitry to indicate, such as by pulsing, that a symbol is an erasure may be avoided as punctured symbols may be known by a decoder in advance of decoding with respect to decoding of a code block. Additionally, for like reasons, circuitry for counting erasures may be avoided. As previously described, RS decode circuitry 540 may include conventional RS iterative decoding circuitry as well as control/glue logic for accepting outputs 525 and 526. Notably, in an implementation, decoding system 221 of FIG. 2C may have RS decode circuitry, such as RS decode circuitry 540, to receive encoded data and provide decoded data 226 responsive to outputs 525 and 526.

Figure 6:
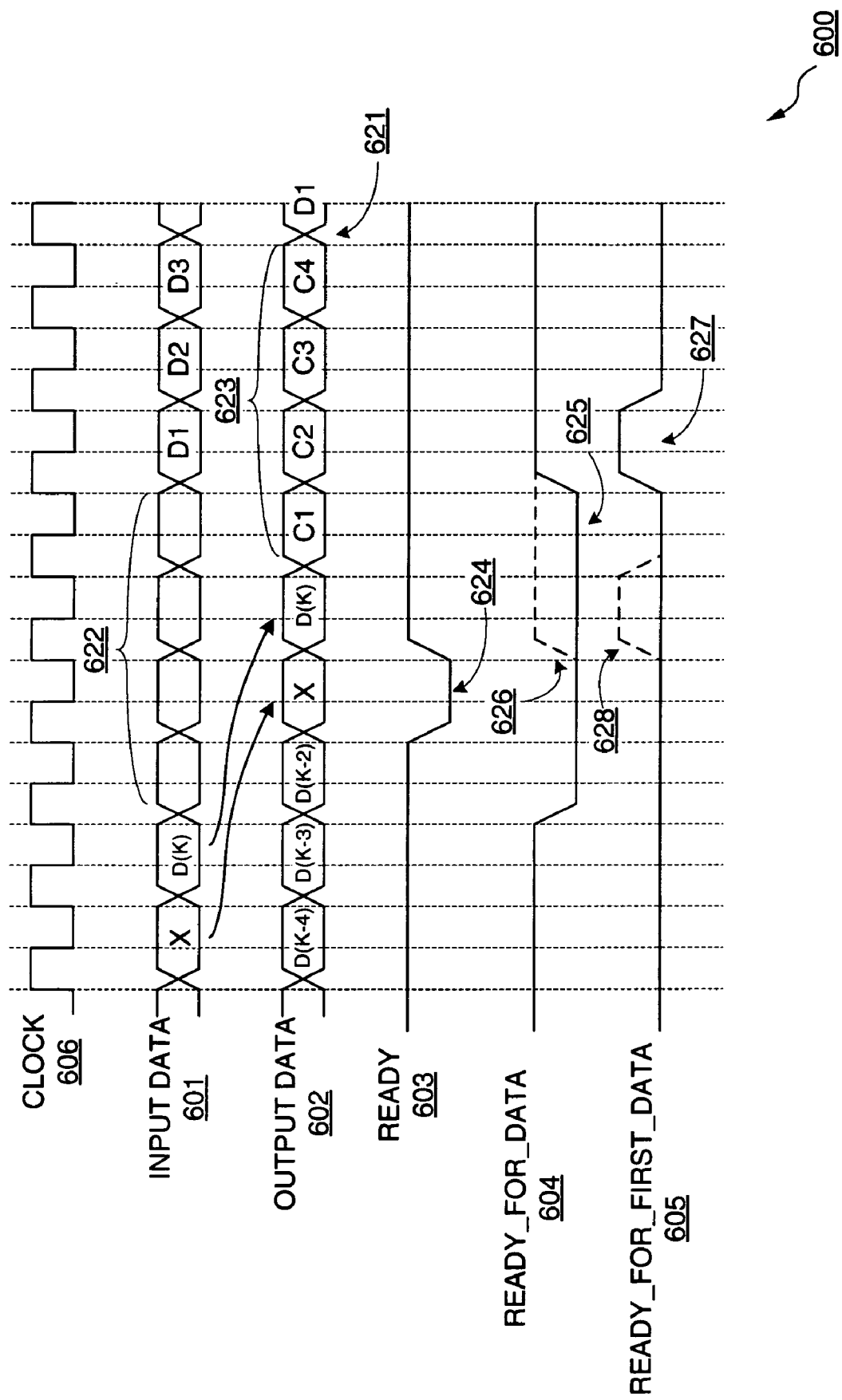
FIG. 6 is a timing diagram depicting an exemplary embodiment of encoder timing for an RS encoder implementation to support arbitrary or selectable puncture patterns.

FIG. 6 is a timing diagram depicting an exemplary embodiment of encoder timing 600. Encoder timing 600 is for an RS encoder implementation to support arbitrary or selectable puncture patterns. Timing 600 may be used for puncture pattern select circuitry 610 of encoder core 201 of FIG. 2B. Accordingly, FIG. 6 is described with simultaneous reference to FIG. 2B.

Notably, RS encoder core 201 generates encoded data 225 using conventional circuitry except that punctured symbols need not be transmitted as part of encoded data 225 but rather may be transmitted as dummy values. Accordingly, a parameterizable RS encoder core 201 may receive an arbitrary puncture pattern as specified by puncture pattern select signal 211A and generate an output symbol stream in encoded data 225 that contains dummy values for punctured symbols. There are many possible circuit implementations for providing a front end of encoder core 201 to count to a value in order to know where puncturing begins at the end of a code block responsive to the value input by puncture pattern select signal 211A. In other words, because punctured symbols need not be encoded, or for that matter transmitted, when any of such symbols are at the end of a code block, they may be ignored for purposes of indicating when encoder core 201 is ready to receive new data. This is in contrast to having to wait until the end of a code block in order to assert a ready signal. In other words, the amount of latency reduction may be directly proportional to the number of punctured symbols at the end of a code block. To provide a more comprehensive description of this type of circuitry operation, timing 600 of encoder core 201 is illustratively shown.

Encoder core 201 is operated responsive to clock signal 606 for inputting input data 601 and for outputting output data 602. In other words, input data 601 is clocked in responsive to clock signal 606 for encoding and clocked out responsive to clock signal 606 as encoded output data 602. Valid output signals may be qualified with a validation signal, namely ready signal 603. Ready signal 603 is de-asserted responsive to a puncture symbol to be output, and such de-assertion may be used to indicate to downstream circuitry that this punctured symbol is to be ignored, namely not to be decoded. In the example of FIG. 6, the D(K−1) datum of input data 601 is to be punctured. Thus, the output symbol X is a dummy value in output data 602 in the D(K−1) location that is not to be considered as real data for the purposes of check bits. To flag this dummy symbol to be punctured, ready signal 603 is de-asserted, as generally indicated by pulse 624 responsive to output dummy symbol X in output data 602, as generally aligned within the same clock period.

RS encoder core 201 may further be configured to determine when it is able to accept new input data. This may be done by assertion of a ready-for-data signal 604 and a ready-for-first-data signal 605. Ready-for-data signal 604 is at a logic high level when RS encoder core 201 is ready to accept input data from input data 601. In this example, D(K) is the end of input data for a code block to be encoded. Thus, in this example the four non-data values, generally indicated at 622, follow D(K) prior to D1 for a next block, namely the first data bits of the next block. As indicated, X and D(K) are part of output data 602 with a three clock cycle latency or delay. Additionally, check symbols C1 through C4 have been added to the end of a code block following the Kth data position, as generally indicated at 623. Thus, at 621, another code block begins.

Ready-for-first-data signal 605 is logic high, as generally indicated by pulse 627, when RS encoder core 201 is ready to accept the start of a new block of input data. In this example, a three cycle latency of clock signal 606 is shown as the difference between assertion of ready-for-first-data signal 605 and the beginning of another block of input data generally at 621.

If it were known that a last number of symbols of a block of encoded data were punctured, then RS encoder core 201 may be ready to accept new data inputs earlier. For example, if the last Z symbols were punctured, for Z an integer, then RS encoder core 201 may accept new data earlier, namely Z clock cycles of clock signal 606 earlier rather than waiting until time 621. For example, assume that check symbols C3 and C4 are to be punctured. Because the last two symbols of a code block of output data 602 are to be punctured in this example, ready-for-data signal 604 may be asserted two clock cycles of clock signal 606 earlier, as may be determined from the difference between the assertion of clock pulse 625 in comparison with the earlier assertion of clock pulse 626, as generally indicated by a dashed line. Moreover, ready-for-first-data signal 605 may be asserted two clock cycles of clock signal 606 earlier, as generally indicated by the difference between assertion of pulse 627 and assertion of dashed-line pulse 628.

Thus, if there are no check symbols at the end of a code block of encoded data to be punctured, pulses 625 of ready-for-data signal 604 and 627 of ready-for-first-data signal 605 are used to indicate when RS encoder core 201 is ready for new data to be encoded. However, in this example, if check symbols C3 and C4 at the end of a block of encoded data are to be punctured, then pulses 626 of ready-for-data signal 604 and 628 of ready-for-first-data signal 605, instead of pulses 625 and 627, respectively, are used. Notably, the falling edge of pulses 625 and 626 is the same, only the rising edge of these pulses is different in time. Accordingly, encoder core 201 may have pattern selection circuitry 610 configured for latency reduction coupled to receive puncture pattern select signal 211A in order to determine the amount of latency reduction, if any, that may be used for assertion of ready-for-data signal 604 and ready-for-first-data signal 605.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, although RS coding has been described, it should be appreciated that other known types of block codes for variable block length may be used. Claim(s) listing steps do not imply any order of the steps. Trademarks are the property of their respective owners.

What is claimed is:

1. A computer-implemented method for generating a core, wherein at least one step of the method is performed by a computer, the method comprising:
    providing a puncture pattern input to a core generator, the puncture pattern input including puncture patterns for a generator polynomial; and
    generating the core with the core generator, the core configured to provide coding responsive to the puncture patterns.

2. The method according to claim 1, wherein the core is a design selected from the group consisting of an encoder design and a decoder design.

3. The method according to claim 1, wherein the core is for instantiation in at least one type of logic selected from the group consisting of hardwired logic and programmable logic of an integrated circuit.

4. The method according to claim 3, wherein the puncture patterns include a null set.

5. The method according to claim 1, wherein the generator polynomial is an error locator polynomial for a block code.

6. The method according to claim 5, wherein the block code is a Reed-Solomon code.

7. The method according to claim 5, wherein the core is configured to handle variable length code blocks of the block code less than a maximum code block length, the variable length code blocks being respectively treated as fixed length blocks.

8. The method according to claim 7, wherein the core is configured for puncturing of a variable number of symbols within the variable length code blocks.

9. The method according to claim 8, wherein the variable number of symbols includes at least one of 0, 4, 8, or 12 symbols; and wherein the puncture pattern input is provided as a file having puncture patterns associated with the variable number of symbols.

10. The method according to claim 1, further comprising:
computing sets of initial error coefficient values for the generator polynomial for each of the puncture patterns; and
storing the sets of initial error coefficient values for access by an integrated circuit implementation of the core, the core being implemented as a decoder.

11. A decoder for a block code, comprising:
a memory;
decoder circuitry having access to the memory;
the memory storing sets of pre-computed initial error coefficient values for access by the decoder, the sets of pre-computed initial error coefficient values being for an error locator polynomial of a block code;
the decoder circuitry designed to receive a puncture select input and configured to select responsive to the puncture select input a set of pre-computed initial error coefficient values from the sets of pre-computed initial error coefficient values; and
the decoder circuitry configured to decode with puncturing responsive to the block code and to a puncture pattern associated with the puncture select input.

12. The decoder according to claim 11, wherein the memory includes a first memory space and a second memory space,
the first memory space for storing puncture vector information retrieved responsive to the puncture select input, and
the second memory space being divided into sections for respectively storing the sets of pre-computed initial error coefficients.

13. The decoder according to claim 12, further comprising a counter configured to count for outputting first address bits for the second memory space.

14. The decoder according to claim 13, wherein the puncture select input provides second address bits for concatenation with the first address bits for respectively accessing the sets of pre-computed initial error coefficient values, the second address bits for accessing a section of the sections, and the first address bits for accessing a first value of the set of initial error coefficient values in the section and for incrementally accessing each value after the first value to at least a last value of the set of pre-computed initial error coefficient values.

15. The decoder according to claim 14, wherein the last value of the set of initial error coefficient values is followed by zero or any other value padding.

16. The decoder according to claim 14, wherein the memory and the decoder circuitry are co-located on a same integrated circuit.

17. The decoder according to claim 16, wherein the integrated circuit is a programmable logic device, and wherein the decoder circuitry is instantiated in programmable logic of the programmable logic device.

18. An encoder for a block code, comprising:
an encoding core configured to receive input data and to provide output data encoded with the block code and with puncturing; and
the encoding core configured to receive a puncture select input and to provide ready for data signaling responsive to a puncture pattern selected responsive to the puncture select input,
wherein the ready for data signaling is asserted with a first delay responsive to no output symbol at an end of a code block of the output data to be punctured.

19. The encoder according to claim 18, wherein the ready for data signaling is asserted with a second delay less than the first delay responsive to at least one output symbol at the end of the code block to be punctured.

20. The encoder according to claim 19, wherein the second delay is one clock cycle less than the first delay for each output symbol at the end of the code block to be punctured.

* * * * *